(12) United States Patent
Parker et al.

(10) Patent No.: US 6,297,988 B1
(45) Date of Patent: Oct. 2, 2001

(54) MODE INDICATOR FOR MULTI-LEVEL MEMORY

(75) Inventors: Allan Parker; Joseph Kucera, both of Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/513,402

(22) Filed: Feb. 25, 2000

(51) Int. Cl.[7] .................................................. G11C 16/04
(52) U.S. Cl. ................... 365/185.03; 365/185.11; 365/185.12; 365/168
(58) Field of Search .................. 365/185.03, 185.11, 365/185.12, 185.09, 168

(56) References Cited

U.S. PATENT DOCUMENTS

| | | | |
|---|---|---|---|
| 4,567,579 | * 1/1986 | Patel et al. | 365/189.05 |
| 5,302,870 | 4/1994 | Chern | 307/530 |
| 5,429,968 | 7/1995 | Koyama | 437/48 |
| 5,457,650 | 10/1995 | Sugiura et al. | 365/184 |
| 5,523,972 | 6/1996 | Rashid et al. | 365/185.22 |
| 5,541,886 | * 7/1996 | Hasbun | 365/185.03 |
| 5,563,828 | * 10/1996 | Hasbun et al. | 365/185.33 |
| 5,596,526 | 1/1997 | Assar et al. | 365/185.17 |
| 5,602,789 | 2/1997 | Endoh et al. | 365/201 |
| 5,689,679 | 11/1997 | Jouppi | 395/449 |
| 5,815,436 | 9/1998 | Tanaka et al. | 365/185.03 |
| 5,831,900 | 11/1999 | Miyamoto | 365/185.03 |
| 5,847,992 | 12/1998 | Tanaka et al. | 365/185.03 |
| 5,852,575 | 12/1998 | Sugiura et al. | 365/184 |
| 5,862,074 | * 1/1999 | Park | 365/185.03 |
| 5,949,101 | 9/1999 | Aritome | 257/315 |
| 5,986,929 | 11/1999 | Sugiura et al. | 365/185.03 |
| 6,026,015 | 2/2000 | Hirakawa | 365/185.03 |
| 6,028,792 | 2/2000 | Tanaka et al. | 365/185.22 |

FOREIGN PATENT DOCUMENTS

WO 99/07000   2/1999   (WO) .

* cited by examiner

*Primary Examiner*—David Nelms
*Assistant Examiner*—Gene N. Auduong

(57) ABSTRACT

A memory device having a plurality of memory cells that are group into at least two group of cells. Each cell is capable of being programmed in at least two modes. A mode indicator is associated with each group of cells. The mode indicator indicates which programming mode is used to access the cells. The mode indicator is one or more bits and optionally is user selectable.

20 Claims, 4 Drawing Sheets

MODE INDICATOR FOR MULTI-LEVEL MEMORY

BACKGROUND

A flash memory cell can be a field effect transistor (FET) that includes a select gate, a floating gate, a drain, and a source. A cell can be read by grounding the source, and applying a voltage to a bitline connected with the drain. By applying a voltage to the wordline connected to the select gate, the cell can be switched on and off.

Programming a cell includes trapping excess electrons in the floating gate to increase voltage. This reduces the current conducted by the memory cell when the select voltage is applied to the select gate. The cell is programmed when the cell current is less than a reference current when the select voltage is applied. The cell is erased when the cell current is greater than the reference current and the select voltage is applied.

Memory cells with only two programmable states contain only a single bit of information, such as a "0" or a "1". A multi-level cell ("MLC") is a cell that can be programmed with more than one voltage level. Each voltage level is mapped to corresponding bits of information. For example, a single multilevel cell can be programmed with one of four voltage levels, e.g. −2.5V, 0.0V, +1.0V, +2.0V that correspond to binary bits "00", "01", "10", and "11", respectively. A cell that is programmable at more voltage levels can store more bits of data based on Eqn. 1.

$$N=2^B \qquad \text{Eqn. 1}$$

B is the number of bits of data stored

N is the number of voltage levels.

Thus, a 1 bit cell requires 2 voltage levels, a 2 bit cell requires 4 voltage levels, a 3 bit cell requires 8 voltage levels, and a 4 bit cell requires 16 voltage levels.

FIG. 1 shows a representation of a single bit programming voltage level diagram 100. The "erase state" program distribution 102 ("erase state"), and the "programmed state" program distribution 104 ("programmed state") represent a single bit being either a "0" or a "1", respectively. The voltage between the upper end 106 of the erase state 102 and ground 108 (0.0V) is the "erase margin." The voltage between ground 108 (0.0V) and the lower end 110 of the programmed state 102 is the "program margin." The erase state program distribution 102 is centered near −2.25V and the programmed state program distribution 104 is centered around 2.25V. The read point can be at ground 108 or anywhere between lines 106 and 110, preferably near the mid-point between lines 106 and 110.

FIG. 2 shows a representation of a four level multilevel cell program voltage diagram 200. The program distribution ("distribution") of the four levels are shown at 210, 212, 214, and 216 respectively. For example, the programming distributions are located at approximately −2.5V, 0.0V, 0.8V, and 2.0V and the width of the programming distributions are approximately 100 to 600 mV. A four level multilevel memory cell can be programmed with any one of these voltage levels. Because the cell can store one of four binary values, it can store 2 bits of information. The program margin (also called "margin", "data margin", or "guard band") is the voltage levels between distributions that is not normally used. For example, the program margins between program distributions 212, 214, and 216 are approximately 800 mV to 100 mV wide. The program margin between program distributions 210 and 212 is approximately 2.0V.

BRIEF SUMMARY OF PREFERRED EMBODIMENTS

A memory device having a plurality of memory cells that are group into at least two group of cells. Each cell is capable of being programmed in at least two modes. A mode indicator is associated with each group of cells. The mode indicator indicates which programming mode is used to access the cells. The mode indicator is one or more bits and optionally is user selectable.

BRIEF DESCRIPTION OF SEVERAL VIEWS OF THE DRAWINGS

The present invention is described with reference to the accompanying figures. In the figures, like reference numbers indicate identical or functionally similar elements. Additionally, the left-most digit(s) of a reference number identifies the figure in which the reference number first appears.

DETAILED DESCRIPTION OF PREFERRED EMBODIMENTS

Since multi-level cells and single bit cells each have advantages and disadvantages it is desirable to access memory cells using both modes. A user selectable mode indicator is associated with each page of memory. The mode indicator indicates which mode is selected for the page (or group), that is, the multi-level mode or the single bit mode. If more than two modes are used, the mode indicator will be more than one bit. A two bit mode indicator indicates four modes and a three bit indicator indicates eight modes. Preferably, the modes are "single bit" and "two bit" and only a single bit is required for the mode indicator for each page. When the mode indicator is a single bit, the default state (erase state) preferably indicates the single bit state.

Multi-level cells while holding more information than a single bit cell can take substantially longer to program, have smaller program margins, and have lower reliability. Further, NAND based multi-level cells are usually addressed on a page-by-page basis. A 64 Mbit (8 Mbyte) memory array can contain 4096 pages where each page contains 512 bytes. A page can be a 4K bit page that has 4096 bits. Interlaced NAND based multi-level cells are read sequentially. For example, if the byte at location 10 is to be read, the bytes at locations 0 through 9 must be read first. That is, interlaced NAND based multi-level cells do not support partial page writes or reads.

Figure 2:
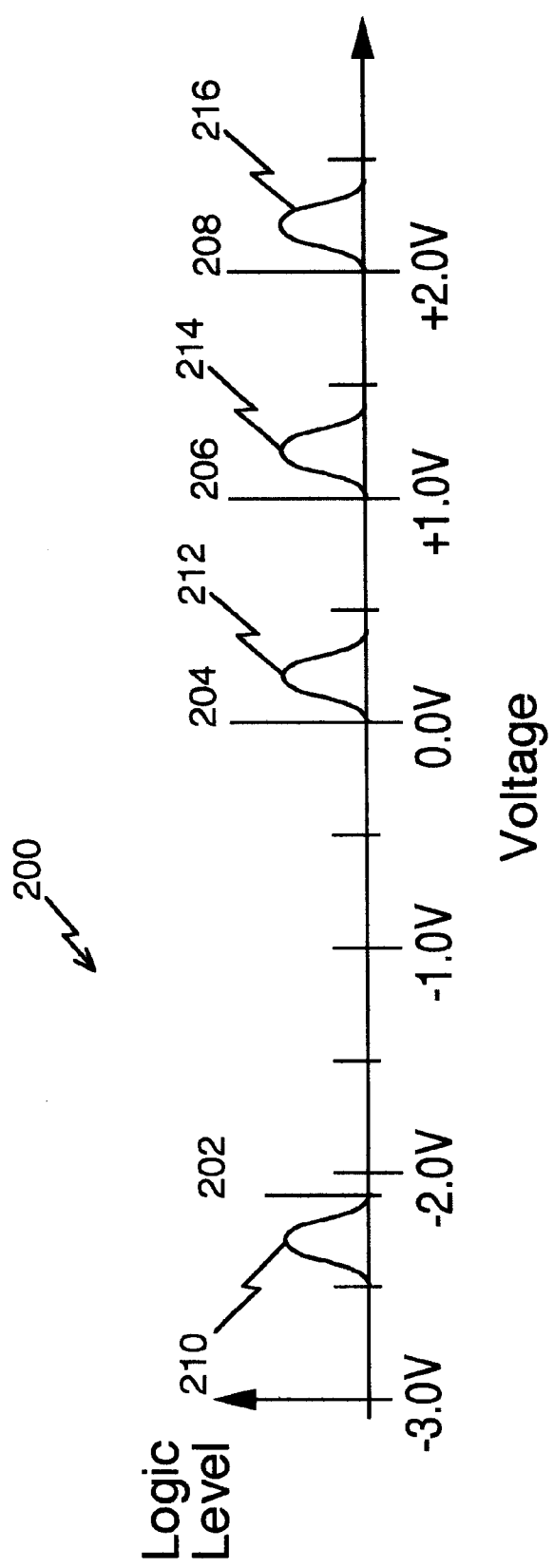
FIG. 2 is a representation of a two bit programming voltage level.

For interlaced MLC accesses and single bit accesses, the first read access can be performed at the same voltage level, e.g. 206 (FIG. 2).

Figure 1:
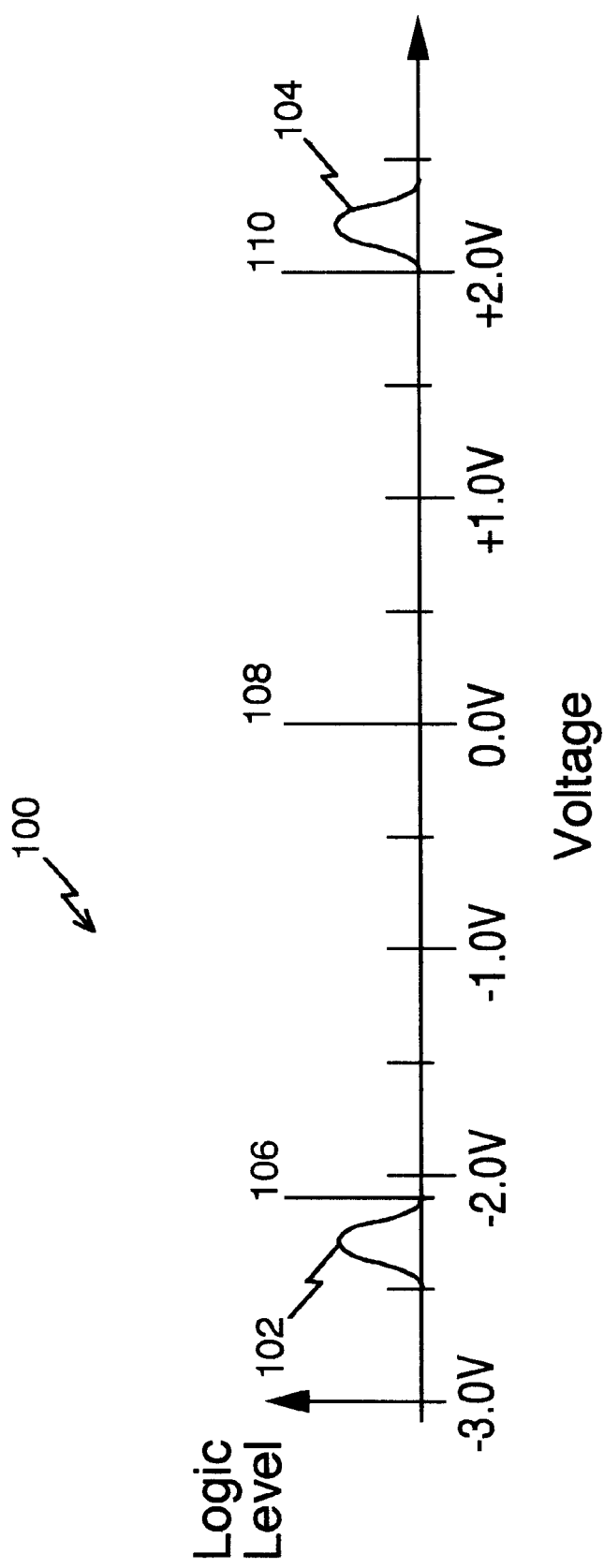
FIG. 1 is a representation of a single bit programming voltage level.

When the mode indicator is in the erase state (e.g. zero), indicating the single bit mode, the reference level will be lowered to 108 (FIG. 1) without significant impact on access times. When the mode indicator is in the programmed state, indicating the multi-bit mode, the memory is accessed with normal MLC access times.

Regardless of the mode selected, the initial read access is similar for both modes. After the initial access, if the mode indicator is set to the multilevel mode a second access would occur.

Figure 3:
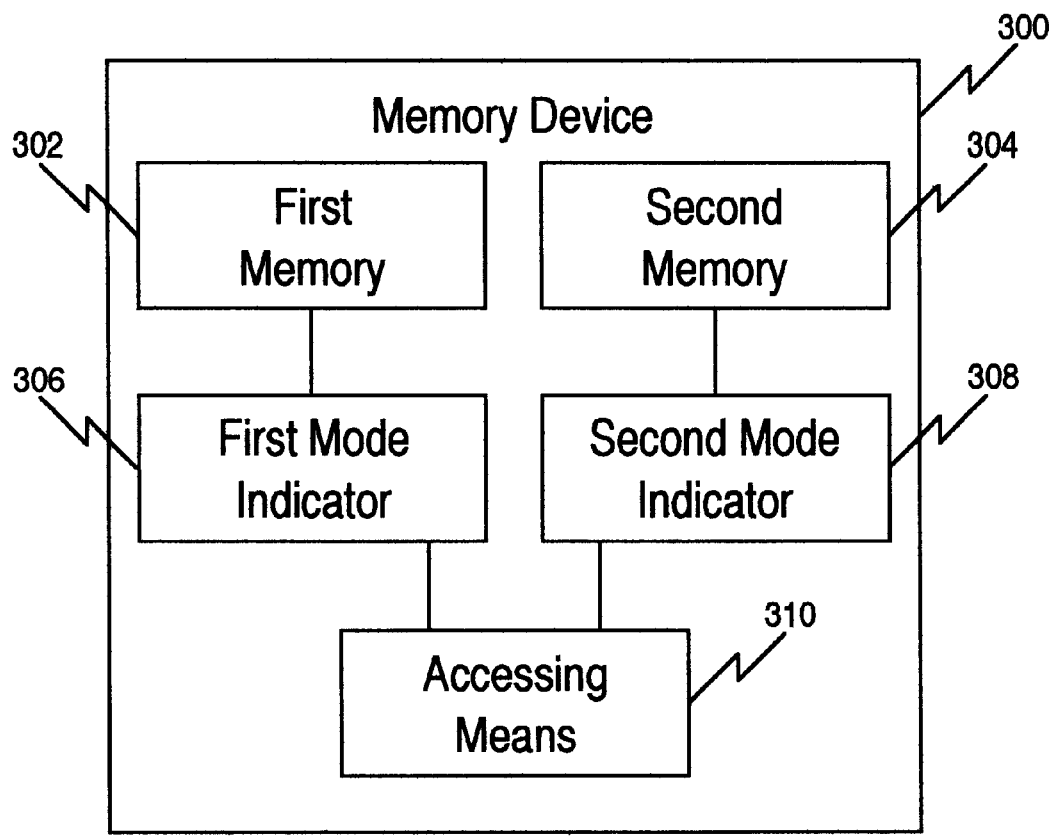
FIG. 3 is a representation of an embodiment of a memory device with mode indicators.

FIG. 3 is an embodiment of a memory device 300 with two groups of memory cells 302, 304 and two mode indicators 306, 308 associated with the respective groups of memory cells. The groups of memory cells 302, 304 can be physically separate memory or, preferably, they are subsets of one physical memory. The mode indicators 306, 308 can be locations in memory, including being part of the same memory as the first and second groups of memory 302, 304. The mode indicators 306, 308 can be a register, non-volatile memory, or volatile memory.

The memory device 300 can include a storage means for storing data capable of storing data in a plurality of storage formats, an indication means for indicating which of the plurality of different formats is to be used to access the data, and an input/output means 310 for accessing the data stored in the storage means. The storage means can include memory cells, memory arrays, flash memory, NAND flash memory, or any other memory storage device. The plurality of storage formats can preferably include a single-bit and a multi-bit format. Multiple multi-bit formats can also be used. The indicator means can include a single memory cell, multiple memory cells, a latch, or other device for storing a value. The storage means can include a plurality of storage areas and the indicator means can include a separate indicator for each storage area. The indicator means with separate indicators for each storage area can be a group of memory cells, a group of latches, or other device for storing the indicators. A storage area can be a page of memory including a 4096 bit page of memory. The storage areas can be of varying sizes and need not each be of equal size.

Figure 4:
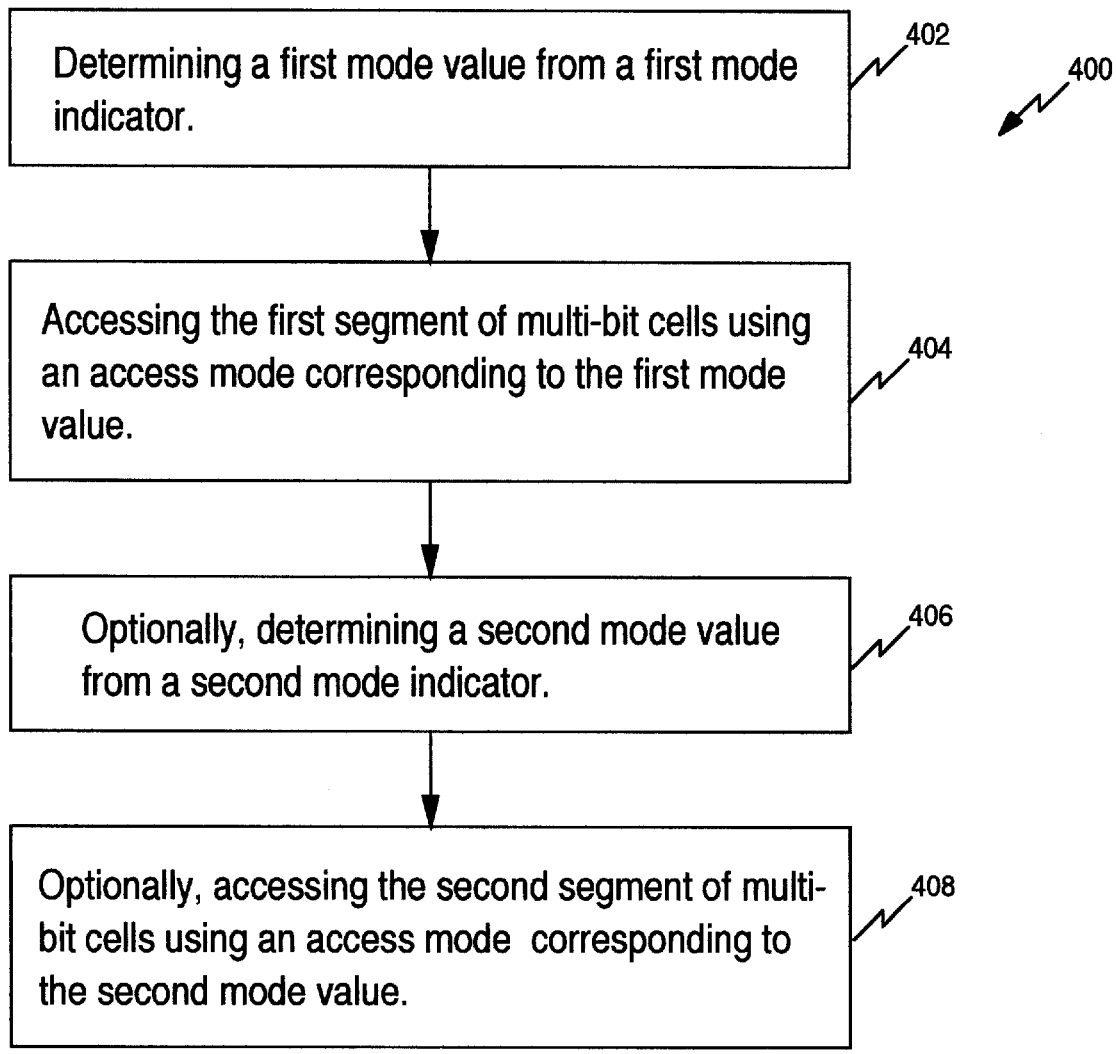
FIG. 4 is a flow diagram of a method of access two segments of memory in two different access modes.

FIG. 4 is a flow diagram of an embodiment of a method 400 of accessing multi-bit memory cells. The method includes determining a first mode value from a first mode indicator 402 then accessing the first segment of multi-bit cells using an access mode corresponding to the first mode value 404. The first mode indicator being associated with a first segment of multi-bit memory cells. The first mode indicator being capable of indicating at least a first and second mode. The first mode including single bit access and the second mode including multi-bit access.

Optionally, the method 400 includes determining a second mode value from a second mode indicator, then accessing the second segment of multi-bit cells using an access mode corresponding to the second mode value. The second mode indicator being associated with a second segment of multi-bit memory cells and being capable of indicating at least a first and second mode. The first mode including single bit access and the second mode including multi-bit access.

While preferred embodiments have been shown and described, it will be understood that they are not intended to limit the disclosure, but rather it is intended to cover all modifications and alternative methods and apparatuses falling within the spirit and scope of the invention as defined in the appended claims or their equivalents.

What is claimed is:

1. A memory device, comprising:
   (a) a plurality of memory cells comprising at least a first and second group of cells, each cell being capable of being programmed in a plurality of programming modes; and
   (b) a first mode indicator associated with the first group of cells, and a second mode indicator associated with the second group of cells each mode indicator being part of the same memory as the first and second groups of memory cells and being capable of indicating one of the plurality of program modes.

2. The memory device of claim 1, wherein the mode indicator is a single bit.

3. The memory device of claim 1, wherein the mode indicator is user programmable.

4. The memory device of claim 1, wherein the mode indicator is user selectable.

5. The memory device of claim 1, wherein the first and second mode indicators are stored in a mode indicator memory.

6. The memory device of claim 1, wherein the first and second group of cells include a first and second page of cells, respectively.

7. The memory device of claim 6, wherein the first and second pages of cells each include at least 4096 cells.

8. The memory device of claim 1, wherein the plurality of modes includes a first mode and a second mode, the first mode being a single bit mode and the second mode being a multi-level mode.

9. The memory device of claim 8, wherein the multi-level mode includes a first, second, third, and fourth programming level and the single bit mode includes a fifth and sixth programming level, the fifth and six programming levels being approximately equal to two of the first, second, third, and fourth programming levels.

10. The memory device of claim 8, wherein the mode indicator defaults to the single bit mode.

11. A method of accessing multi-bit memory cells, comprising:
   (a) determining a first mode value from a first mode indicator, the first mode indicator being associated with a first segment of the multi-bit memory cells, the first mode indicator being capable of indicating at least a first and second mode and being part of the same memory thereof, the first mode comprising single bit access and the second mode comprising multi-bit access; and
   (b) accessing the first segment of multi-bit cells using an access mode corresponding to the first mode value.

12. The method of claim 11, further including:
   (c) determining a second mode value from a second mode indicator, the second mode indicator being associated with a second segment of the multi-bit memory cells, the second mode indicator being capable of indicating at least a first and second mode, the first mode comprising single bit access and the second mode comprising multi-bit access; and
   (d) accessing the second segment of multi-bit cells using an access mode corresponding to the second mode value.

13. The method of claim 12, wherein the first and second segment of multi-bit memory cells are unique.

14. The method of claim 11, wherein said determining a first mode value comprises reading the first mode value from the first mode indicator.

15. The method of claim 11, wherein said accessing the first segment comprises reading data from the first segment of multi-bit memory cells.

16. The method of claim 11, wherein said accessing the first segment comprises writing data to the first segment of multi-bit memory cells.

17. A memory device, comprising:
(a) a storage means for storing data capable of storing data in a plurality of storage formats;
(b) an indication means for indicating which of the plurality of different formats is to be used to access the data, said indication means being part of the same memory as said storage means; and
(c) an accessing means for accessing the data stored in the storage means.

18. The memory device of claim 17, wherein the plurality of storage formats includes a single-bit and a multi-bit format.

19. The memory device of claim 17, wherein the storage means includes a plurality of storage areas and the indicator means includes a separate indicator for each storage area.

20. The memory device of claim 19, wherein each storage area is a page of memory.

* * * * *